United States Patent
O'Brien et al.

(10) Patent No.: US 12,396,254 B2
(45) Date of Patent: Aug. 19, 2025

(54) STACKED 2D CMOS WITH INTER METAL LAYERS

(71) Applicant: Intel Corporation, Santa Clara, CA (US)

(72) Inventors: Kevin P. O'Brien, Portland, OR (US); Uygar E. Avci, Portland, OR (US); Scott B. Clendenning, Portland, OR (US); Chelsey Dorow, Portland, OR (US); Sudarat Lee, Hillsboro, OR (US); Kirby Maxey, Hillsboro, OR (US); Carl H. Naylor, Portland, OR (US); Tristan A. Tronic, Aloha, OR (US); Shriram Shivaraman, Hillsboro, OR (US); Ashish Verma Penumatcha, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 817 days.

(21) Appl. No.: 17/485,225

(22) Filed: Sep. 24, 2021

(65) Prior Publication Data

US 2023/0101760 A1    Mar. 30, 2023

(51) Int. Cl.
| | |
|---|---|
| *H10B 12/00* | (2023.01) |
| *H01L 23/48* | (2006.01) |
| *H10B 10/00* | (2023.01) |
| *H10D 30/67* | (2025.01) |
| *H10D 62/10* | (2025.01) |
| *H10D 64/23* | (2025.01) |

(Continued)

(52) U.S. Cl.
CPC ............ *H10D 84/85* (2025.01); *H01L 23/481* (2013.01); *H10B 10/125* (2023.02); *H10D 30/6713* (2025.01); *H10D 30/6729* (2025.01); *H10D 30/6733* (2025.01); *H10D 30/6735* (2025.01); *H10D 62/118* (2025.01); *H10D 64/258* (2025.01); *H10D 88/00* (2025.01)

(58) Field of Classification Search
CPC ... H10B 10/12; H10B 10/125; H01L 29/0673; H01L 29/42392; H01L 29/78696; H01L 27/092; H01L 27/0688; H10D 30/6735; H10D 62/121
See application file for complete search history.

(56) References Cited

U.S. PATENT DOCUMENTS

2010/0295136 A1* 11/2010 Or-Bach ........... H01L 21/76254
                                                                257/390

* cited by examiner

*Primary Examiner* — Reema Patel
(74) *Attorney, Agent, or Firm* — Schwabe, Williamson & Wyatt, P.C.

(57) ABSTRACT

Embodiments disclosed herein include semiconductor devices and methods of forming such devices. In an embodiment, a semiconductor device comprises a first transistor on a first level, and a second transistor on a second level above the first level. In an embodiment, an insulating layer is between the first level and the second level, and a via passes through the insulating layer, and electrically couples the first transistor to the second transistor. In an embodiment, the first transistor and the second transistor comprise a first channel, and a second channel over the first channel. In an embodiment, the first second transistor further comprise a gate structure between the first channel and the second channel, a source contact on a first end of the first channel and the second channel, and a drain contact on a second end of the first channel and the second channel.

19 Claims, 18 Drawing Sheets

(51) Int. Cl.
*H10D 84/85* (2025.01)
*H10D 88/00* (2025.01)

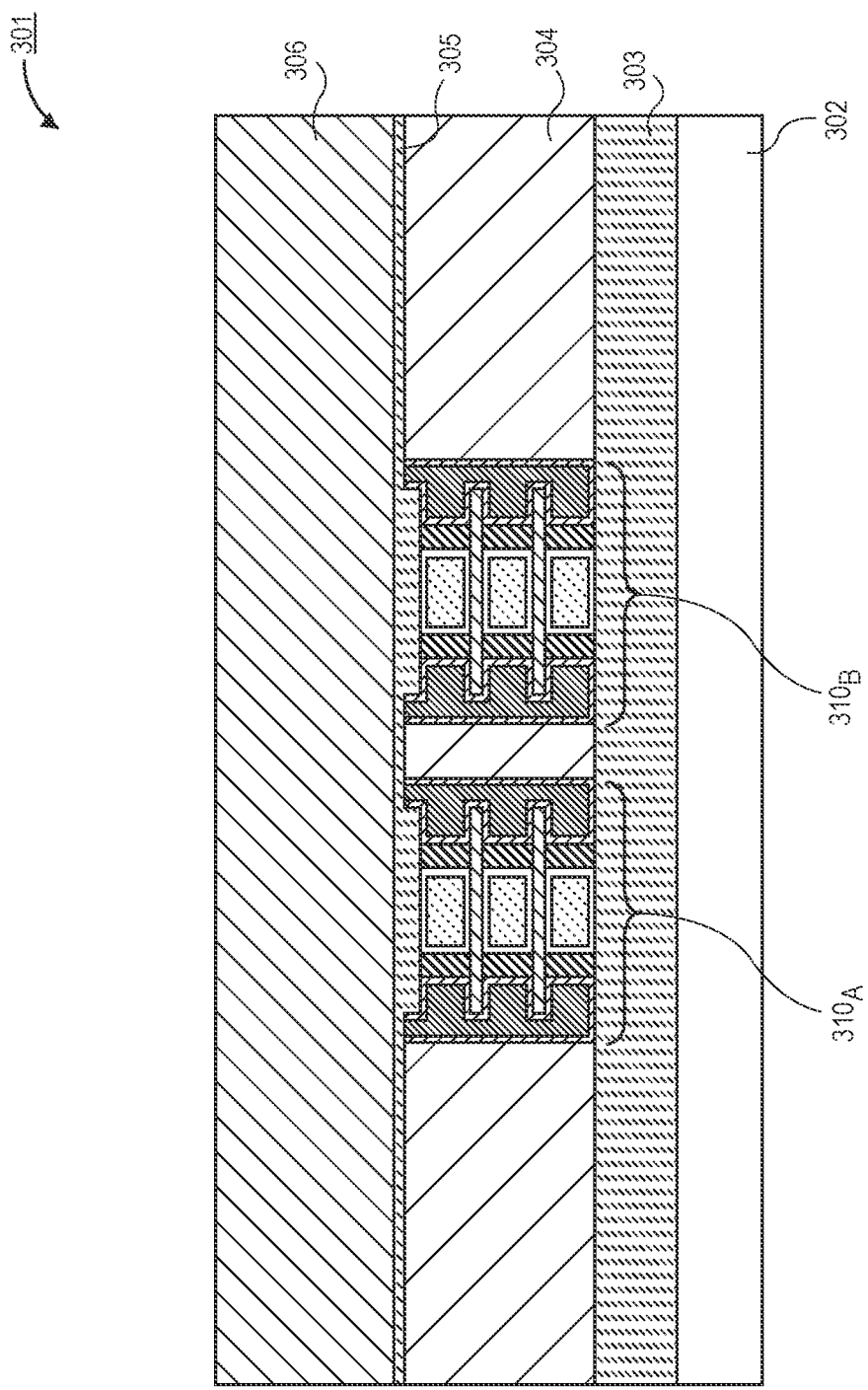

STACKED 2D CMOS WITH INTER METAL LAYERS

TECHNICAL FIELD

Embodiments of the disclosure are in the field of semiconductor structures and processing and, in particular, to stacked 2D CMOS devices with inter metal layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multigate transistors, such as tri-gate transistors and gate-all-around (GAA) transistors, have become more prevalent as device dimensions continue to scale down. Tri-gate transistors and GAA transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIG. 3I is a cross-sectional illustration of the structure after an insulating layer is disposed over the bottom transistors, in accordance with an embodiment.

DESCRIPTION OF THE EMBODIMENTS

Figure 1:
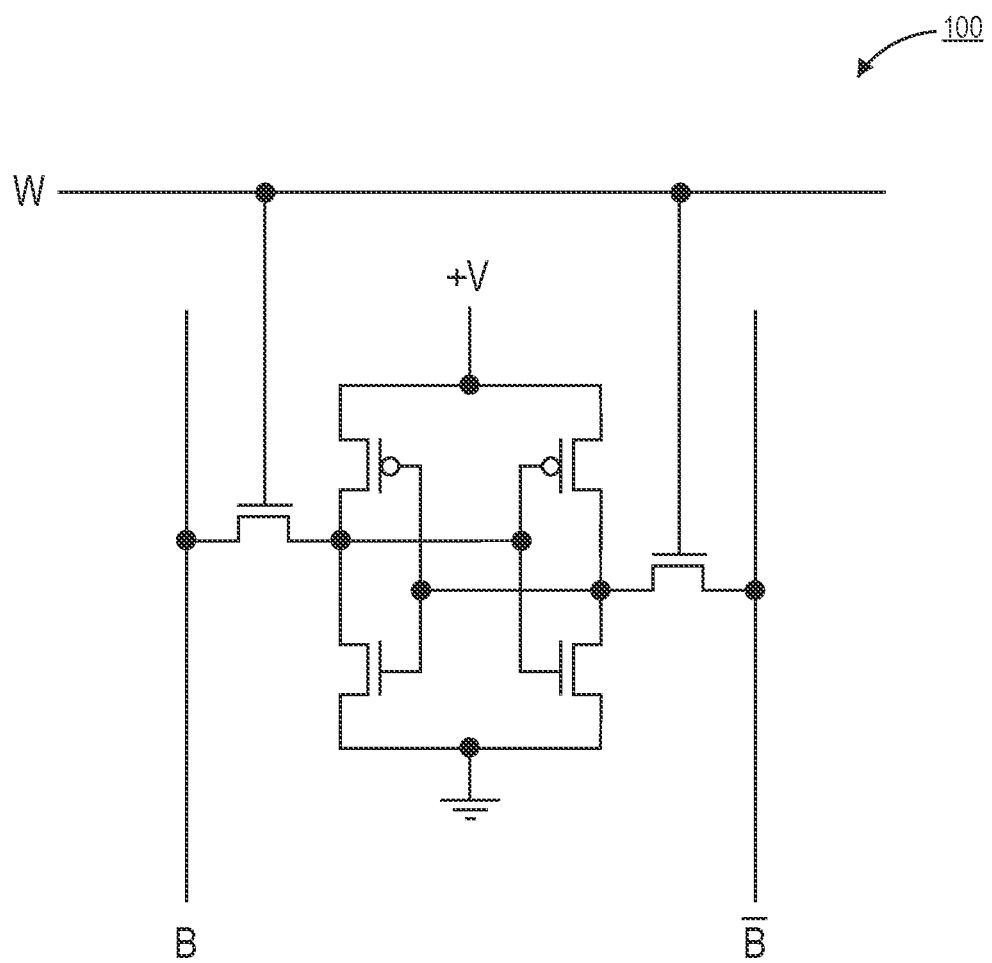
FIG. 1 is a schematic of a six transistor (6T) SRAM cell, in accordance with an embodiment.

Embodiments described herein comprise stacked 2D CMOS devices with inter metal layers. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The continued scaling of transistor devices has led to a decrease in the footprint of memory cells. For example, six transistor (6T) SRAM cells experience improved density by decreasing the footprint of individual transistors. An example of an 6T SRAM cell 100 is shown in FIG. 1. One difficulty to further scaling is the need to have both P-type and N-type transistor devices that are coupled together. In existing stacked architectures there are no metal layers between stacked N-MOS and P-MOS devices.

Accordingly, embodiments disclosed herein include stacked CMOS devices with metal interlayers which enables cell size reduction. In a particular embodiment, such an architecture may be used to reduce the footprint of 6T SRAM cells. However, it is to be appreciated that embodiments may include any cell architecture that requires N-MOS transistors coupled to P-MOS transistors in a stacked configuration.

Figure 2:
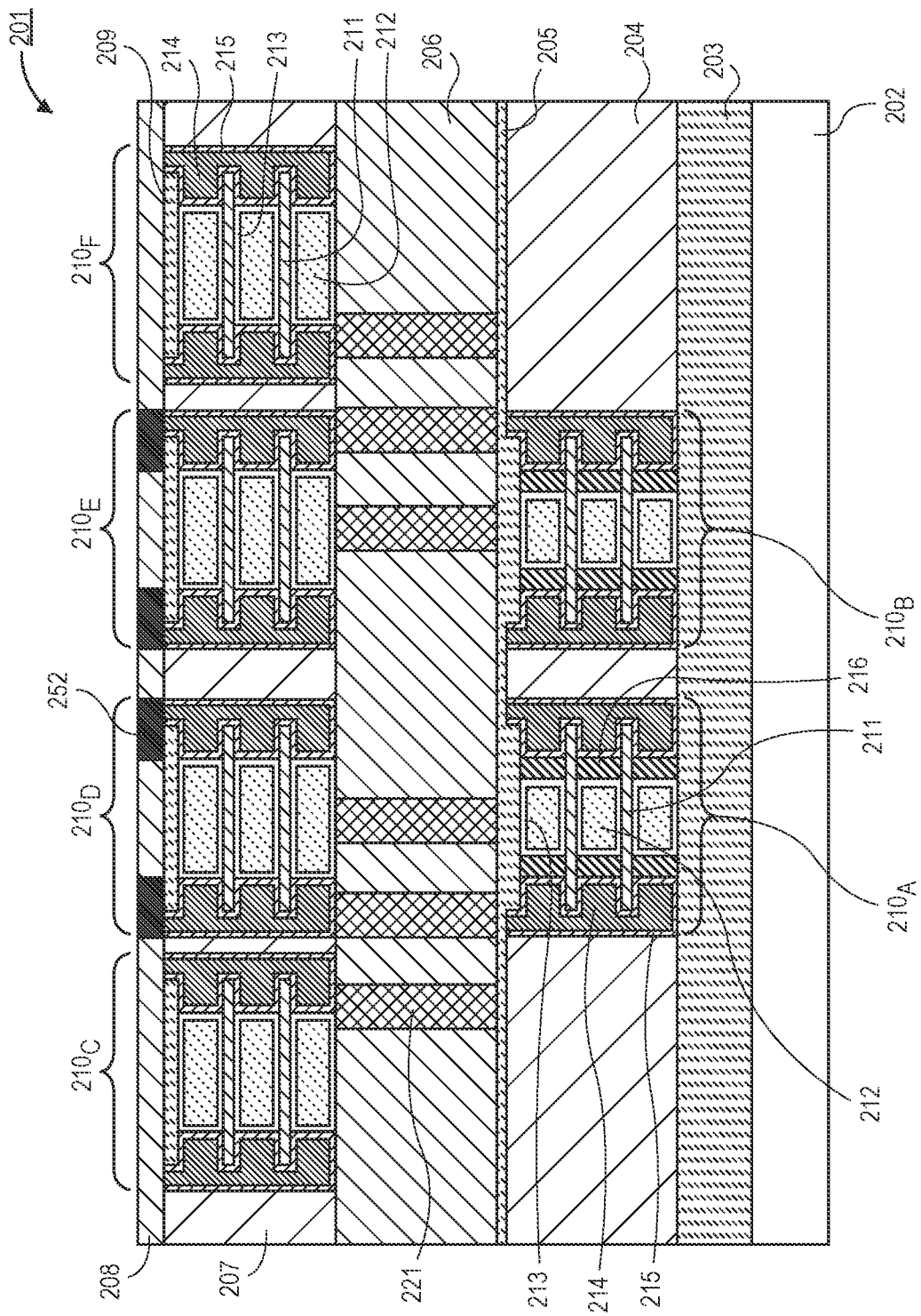
FIG. 2 is a cross-sectional illustration of a semiconductor device with stacked transistors, in accordance with an embodiment.

Referring now to FIG. 2, a cross-sectional illustration of a semiconductor device 201 is shown, in accordance with an embodiment. In an embodiment, the semiconductor device 201 may comprise a plurality of transistors 210. For example, six transistors 210A—210F are shown in FIG. 2. In an embodiment, the transistors 210A and 210E may be provided in a first layer 204, and the transistors 210c-210F may be provided in a second layer 207. In an embodiment, transistors 210A and 210E may be a first conductivity type and the transistors 210c-210F may be a second conductivity type. For example, transistors 210A and 210E may be P-type transistors, and transistors 210c-210F may be N-type transistors.

As shown, the first layer 204 is separated from the second layer 207 by an insulating layer 206. In an embodiment, vias 221 may be provided through the insulating layer 206. The vias 221 may electrically couple transistors 210 in the second layer 207 to transistors 210 in the first layer 204. As such, compact cell architectures are enabled. In the illustrated embodiment, the vias 221 land on insulating layers 205. However, it is to be appreciated that electrical connections to the source/drains and/or gates can be made through the insulating layers 205 out of the plane of FIG. 2.

In an embodiment, the semiconductor device 201 may be formed over a semiconductor substrate 202. In an embodiment, the underlying semiconductor substrate 202 represents a general workpiece object used to manufacture integrated circuits. The semiconductor substrate 202 often includes a wafer or other piece of silicon or another semiconductor material. Suitable semiconductor substrates 202 include, but are not limited to, single crystal silicon, polycrystalline silicon and silicon on insulator (SOI), as well as similar substrates formed of other semiconductor materials, such as substrates including germanium, carbon, or group III-V materials. In an embodiment, an insulating layer 203 is provided over the semiconductor substrate 202. The insulating layer 203 may include a silicon oxide (e.g., $SiO_x$) or a silicon nitride (e.g., $SiN_x$).

In an embodiment, transistors 210A and 210E are provided in the first layer 204 over the insulating layer 203. In an embodiment, the transistors 210A and 210E may each comprise one or more semiconductor channels 211. In an embodiment, the semiconductor channels 211 may include nanoribbon, nanosheet, or nanowire form factors. Generally, the semiconductor channels 211 may be suitable form factors for gate-all-around (GAA) transistor architectures. In an embodiment, the semiconductor channels 211 may include any suitable semiconductor material. For example, the semiconductor channels 211 may comprise silicon.

In an embodiment, the semiconductor channels 211 may be surrounded by a gate structure. The gate structure may include a gate dielectric 213 and a gate metal 212. The gate dielectric 213 may be a high-k dielectric material. As used herein, high-k may refer to a dielectric constant equal to or greater than the dielectric constant of silicon dioxide ($SiO_2$). Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

In an embodiment, the gate metal 212 may comprise a workfunction metal and a fill metal. When the gate metal 212 will serve as an N-type workfunction metal, the gate metal 212 preferably has a workfunction that is between about 3.9 eV and about 4.2 eV. N-type materials that may be used to form the gate metal 212 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the gate metal 212 will serve as a P-type workfunction metal, the gate metal 212 preferable has a workfunction that is between about 4.9 eV and about 5.2 eV. P-type materials that may be used to form the gate metal 212 include, but are not limited to, ruthenium, palladium, platinum, cobalt, nickel, and conductive metal oxides, e.g., ruthenium oxide.

In an embodiment, source contacts and drain contacts (sometimes referred to collectively as source/drain contacts) may be provided around the ends of the semiconductor channels 211. In an embodiment, the source/drain contacts may comprise a conformal liner 215 and a fill metal 214. For example, the conformal liner 215 may include antimony, and the fill metal 214 may comprise gold. In an embodiment, the source/drain contacts 214/215 may be physically separated from the gate structure 213/214 by spacers 216.

In an embodiment, transistors 210c-210F are provided in the second layer 207 over the insulating layer 206. In an embodiment, the transistors 210c-210F may each comprise one or more semiconductor channels 211. In an embodiment, the semiconductor channels 211 may include nanoribbon, nanosheet, or nanowire form factors. Generally, the semiconductor channels 211 may be suitable form factors for GAA transistor architectures. In an embodiment, the semiconductor channels 211 may include any suitable semiconductor material. For example, the semiconductor channels 211 may comprise silicon.

In an embodiment, the semiconductor channels 211 may be surrounded by a gate structure. The gate structure may include a gate dielectric 213 and a gate metal 212. The gate dielectric 213 may be a high-k dielectric material, such as one of the high-k dielectric materials listed above. In an embodiment, the gate metal 212 may comprise a workfunction metal and a fill metal. The workfunction metal may be one of the workfunction metals listed above.

In an embodiment, the ends of the semiconductor channels 211 may be surrounded by source/drain contacts. For example, the source/drain contacts may comprise a conformal liner 215 and a fill metal 214. For example, the conformal liner 215 may include antimony, and the fill metal 214 may comprise gold. In contrast to the transistors 210A and 210B, the source/drain contacts 215/214 may be separated from the gate metal 212 by the gate dielectric 213.

In an embodiment, an insulating layer 209 may be provided above the gate structure 212/213 of each of the transistors 210c-210F. An additional insulating layer 208 may also be provided above the transistors 210c-210F. In an embodiment, contacts 252 may pass through the insulating layer 208 to provide electrical connections to the source/drain contacts 214/215.

Figure 3A:
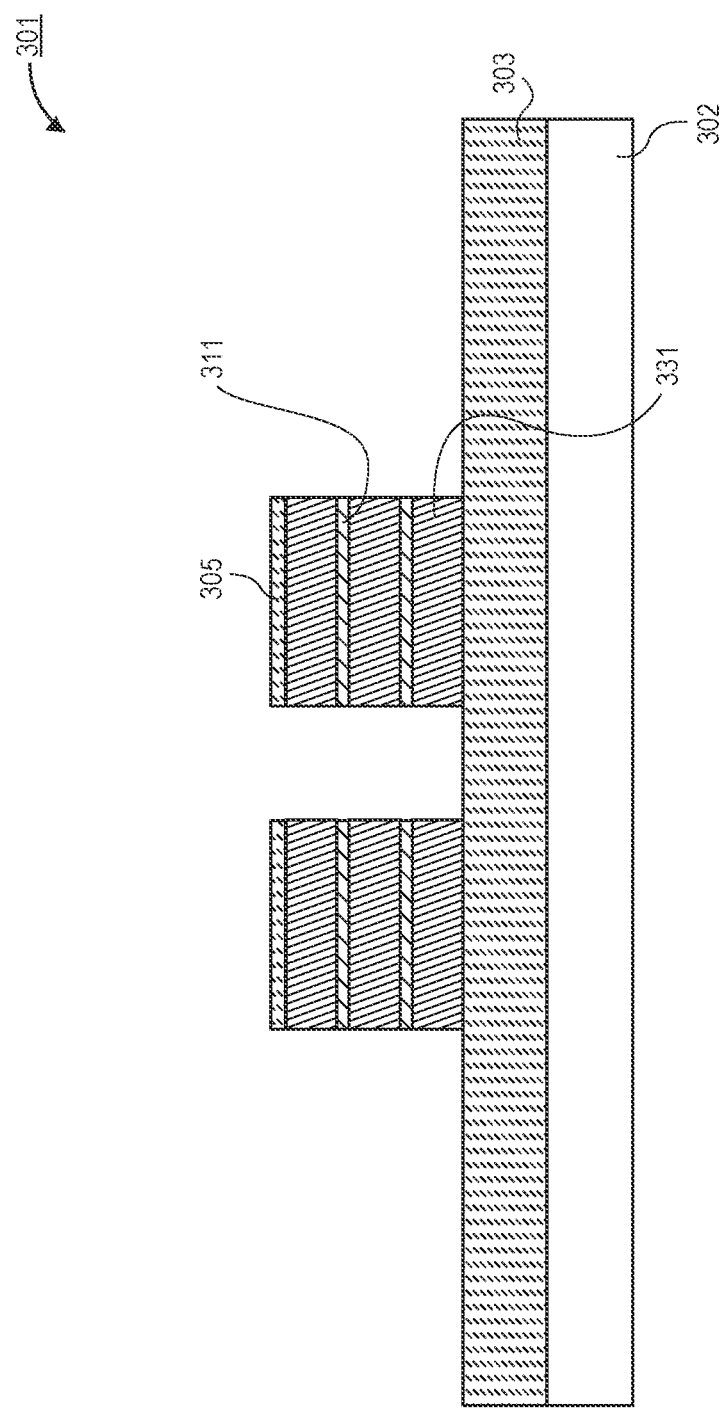
FIG. 3A is a cross-sectional illustration of device stacks with channels and sacrificial layers over a substrate, in accordance with an embodiment.
Figure 3B:
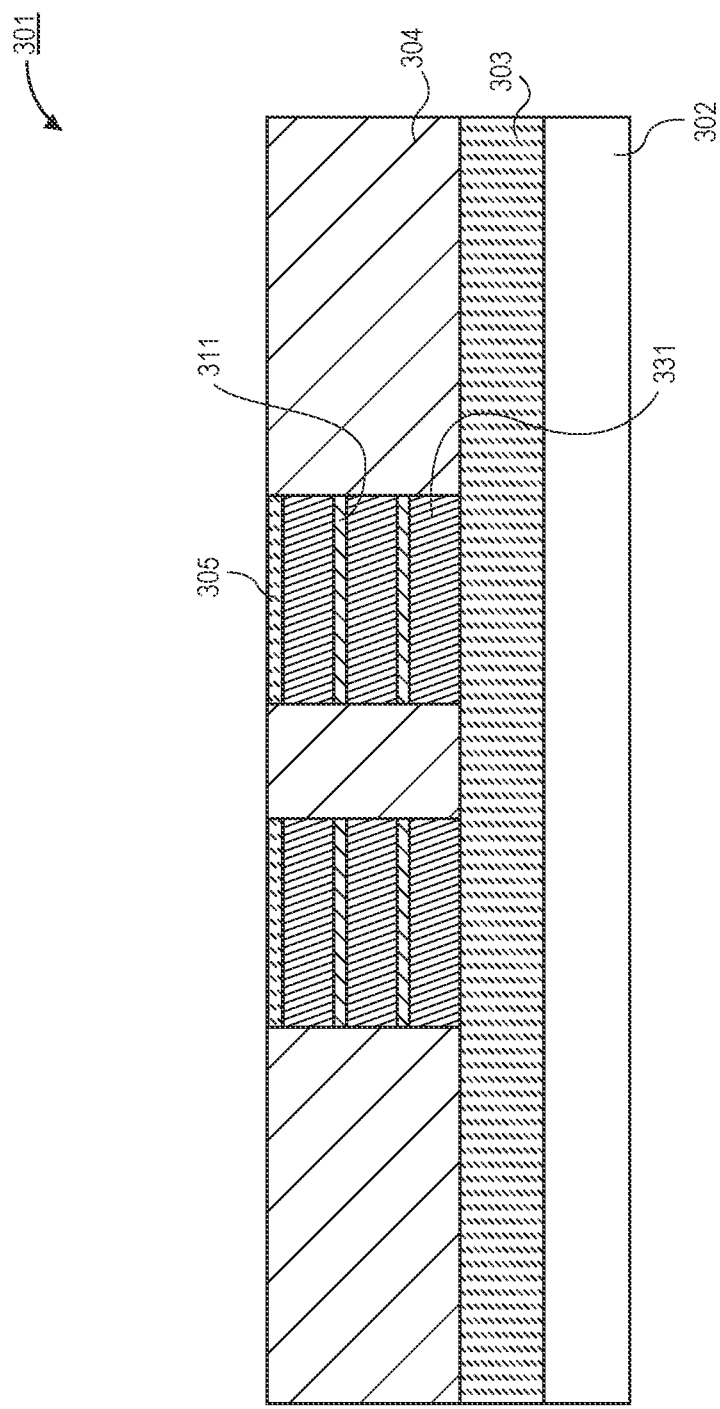
FIG. 3B is a cross-sectional illustration of the structure after an insulating layer is disposed around the device stacks, in accordance with an embodiment.
Figure 3C:
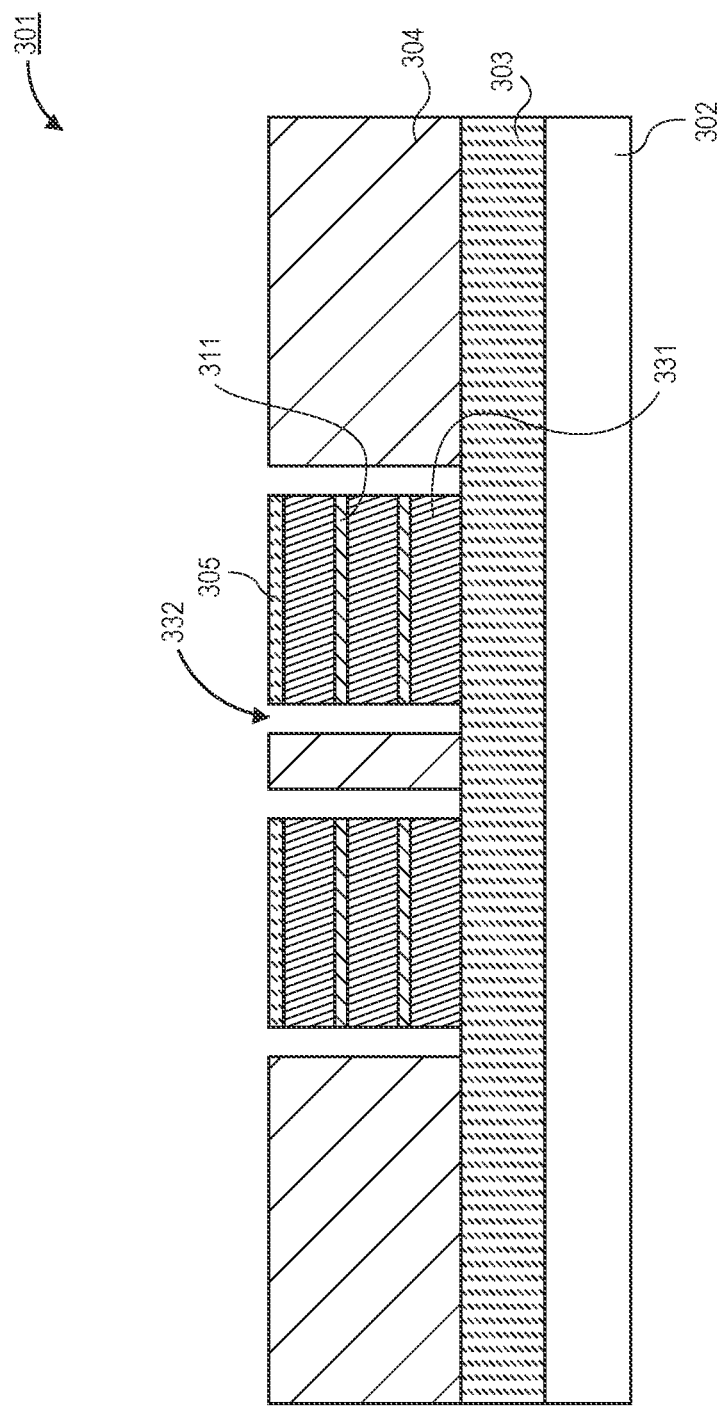
FIG. 3C is a cross-sectional illustration of the structure after openings are formed at the ends of the device stacks, in accordance with an embodiment.
Figure 3D:
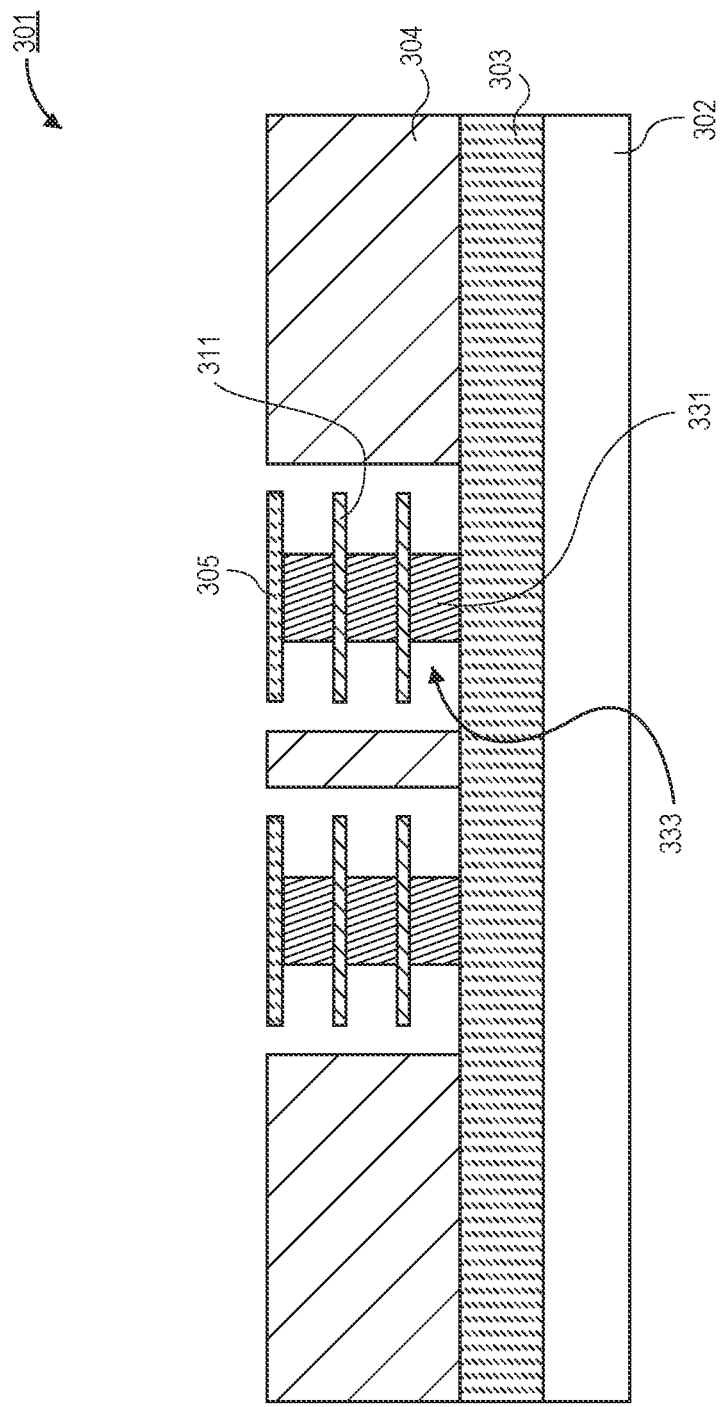
FIG. 3D is a cross-sectional illustration of the structure after the sacrificial layers are recessed, in accordance with an embodiment.
Figure 3E:
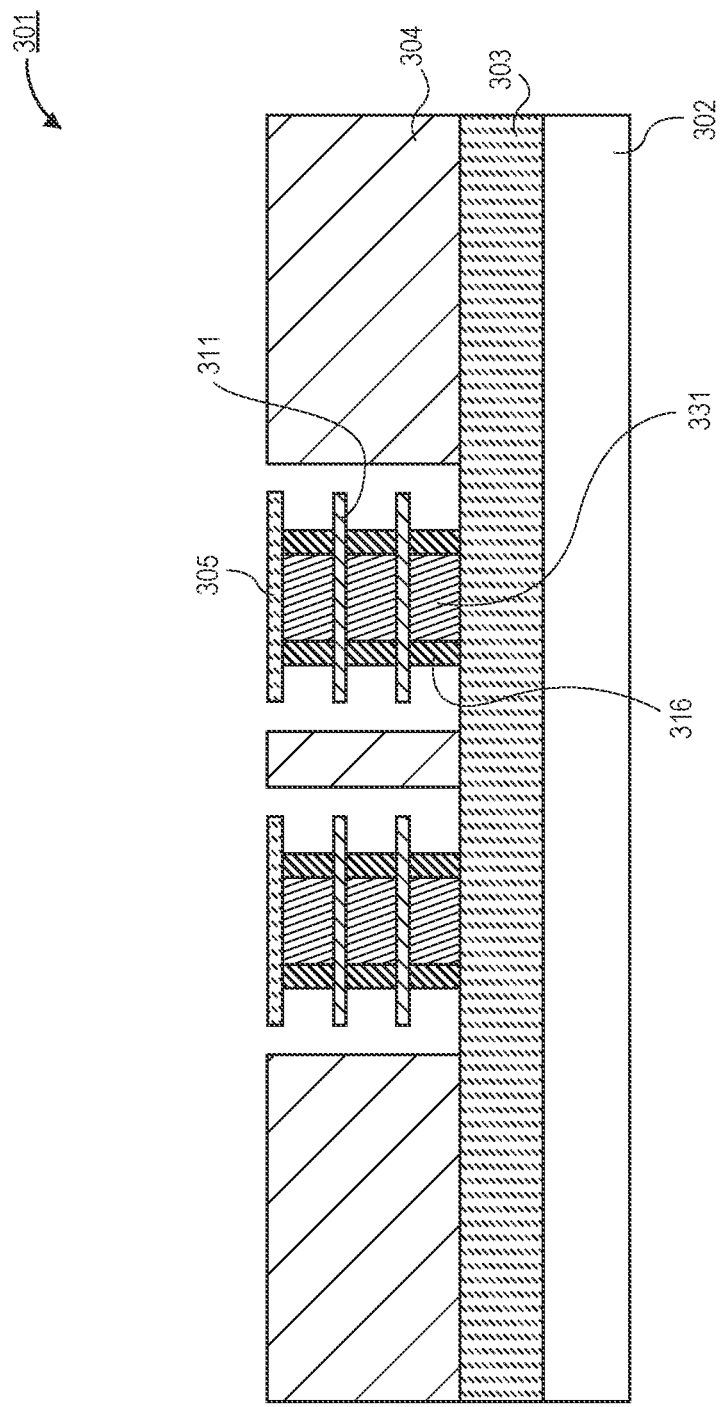
FIG. 3E is a cross-sectional illustration of the structure after spacers are provided at the ends of the sacrificial layers, in accordance with an embodiment.
Figure 3F:
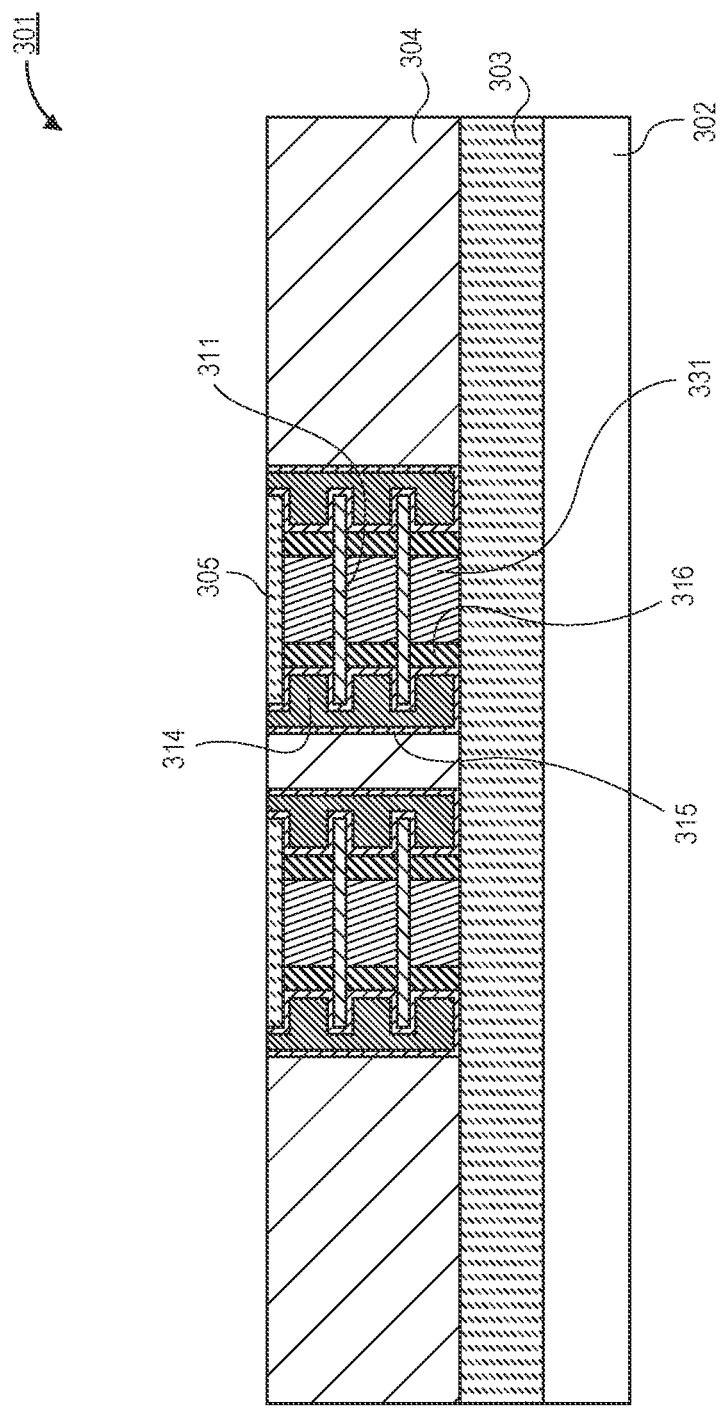
FIG. 3F is a cross-sectional illustration of the structure after source contacts and drain contacts are formed, in accordance with an embodiment.
Figure 3G:
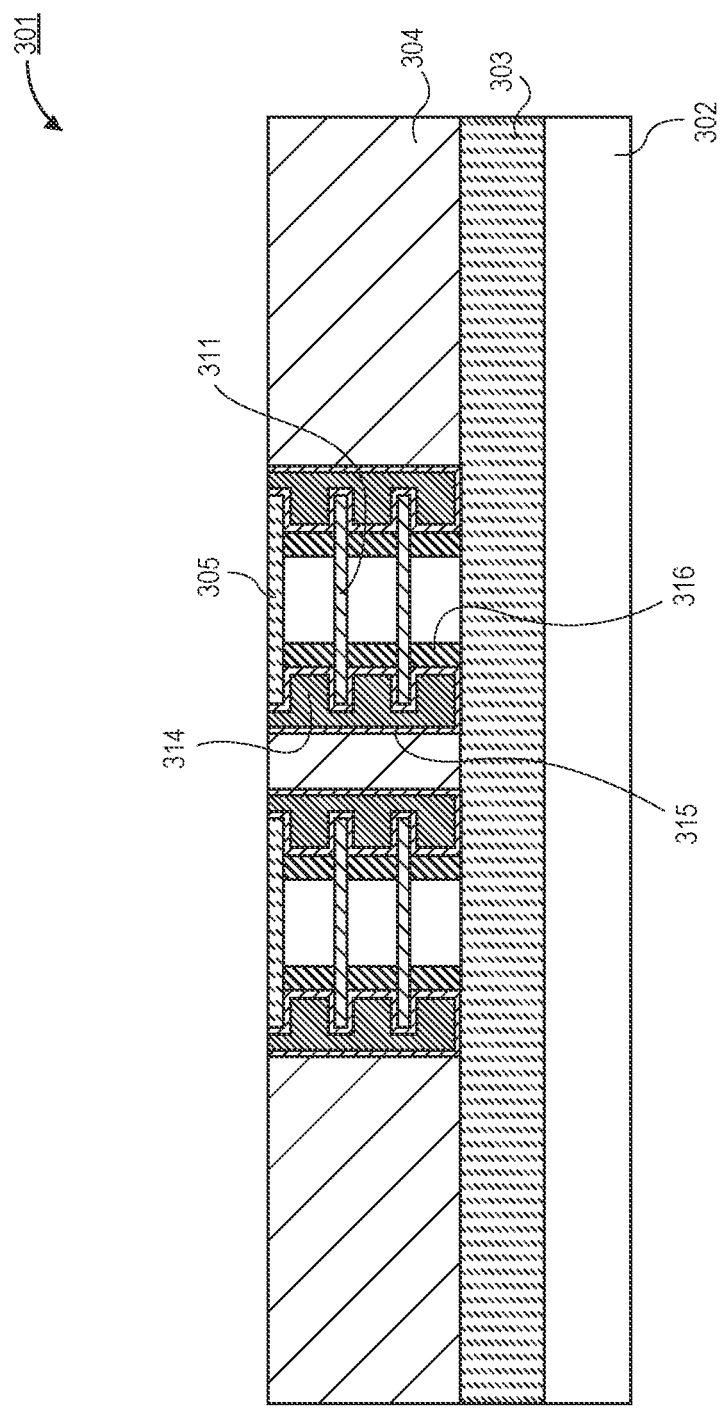
FIG. 3G is a cross-sectional illustration of the structure after the sacrificial layers are fully removed, in accordance with an embodiment.
Figure 3H:
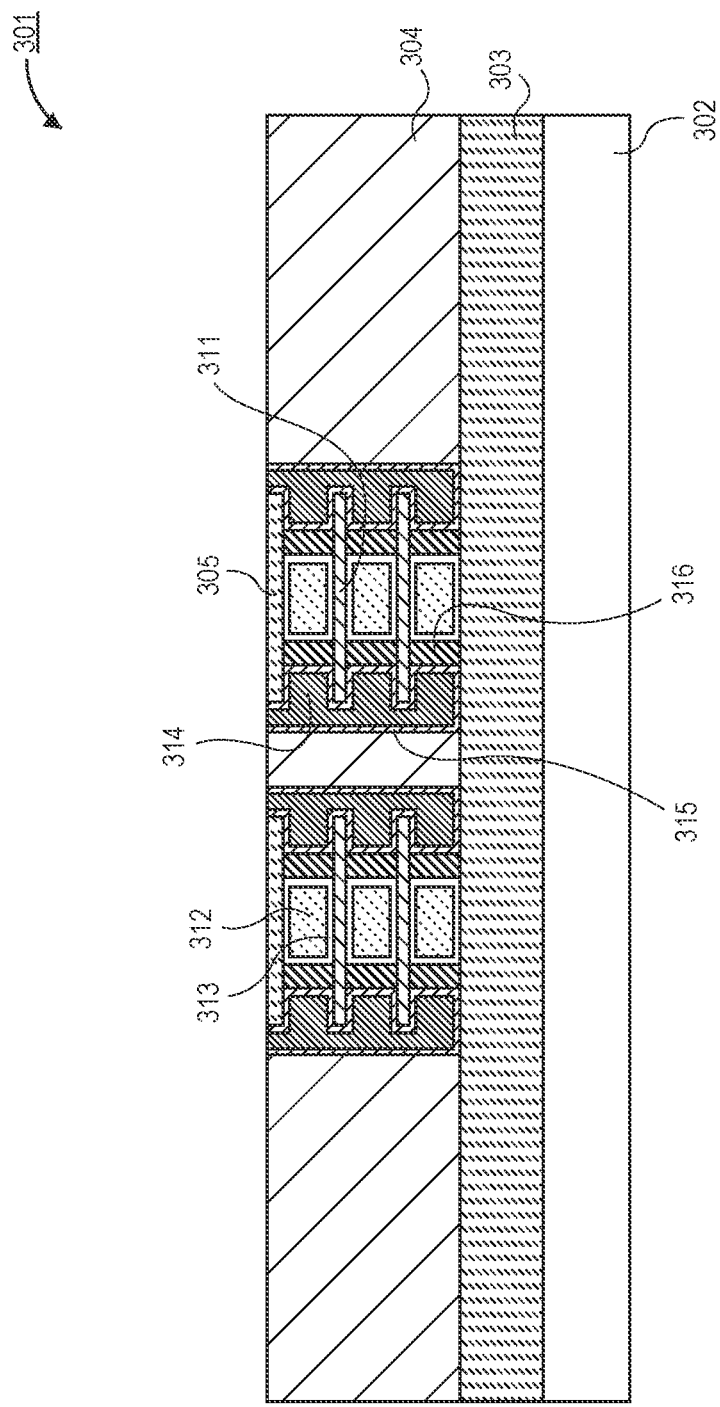
FIG. 3H is a cross-sectional illustration of the structure after a gate structure is formed around the channels, in accordance with an embodiment.
Figure 3J:
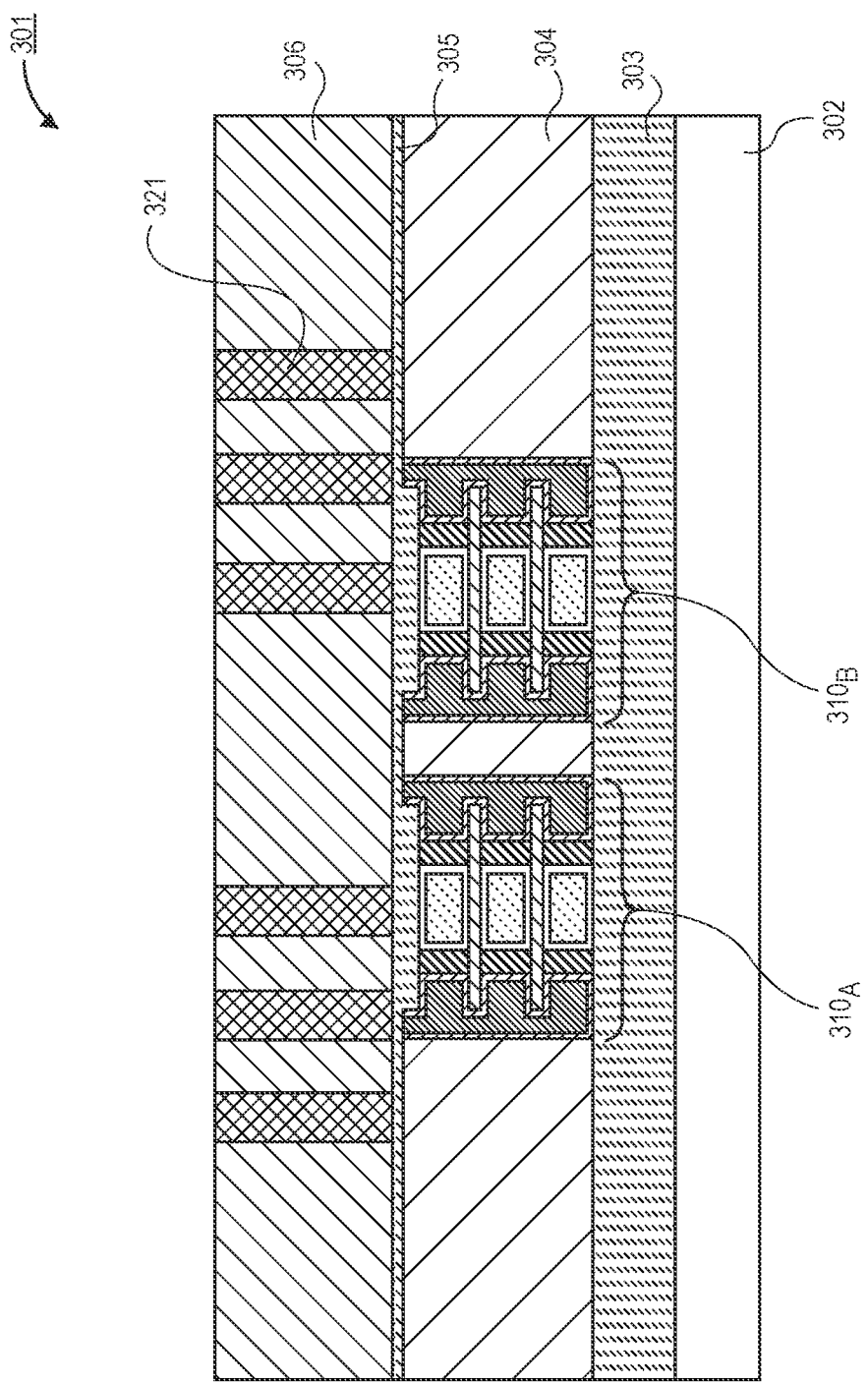
FIG. 3J is a cross-sectional illustration of the structure after vias are formed through the insulating layer, in accordance with an embodiment.
Figure 3K:
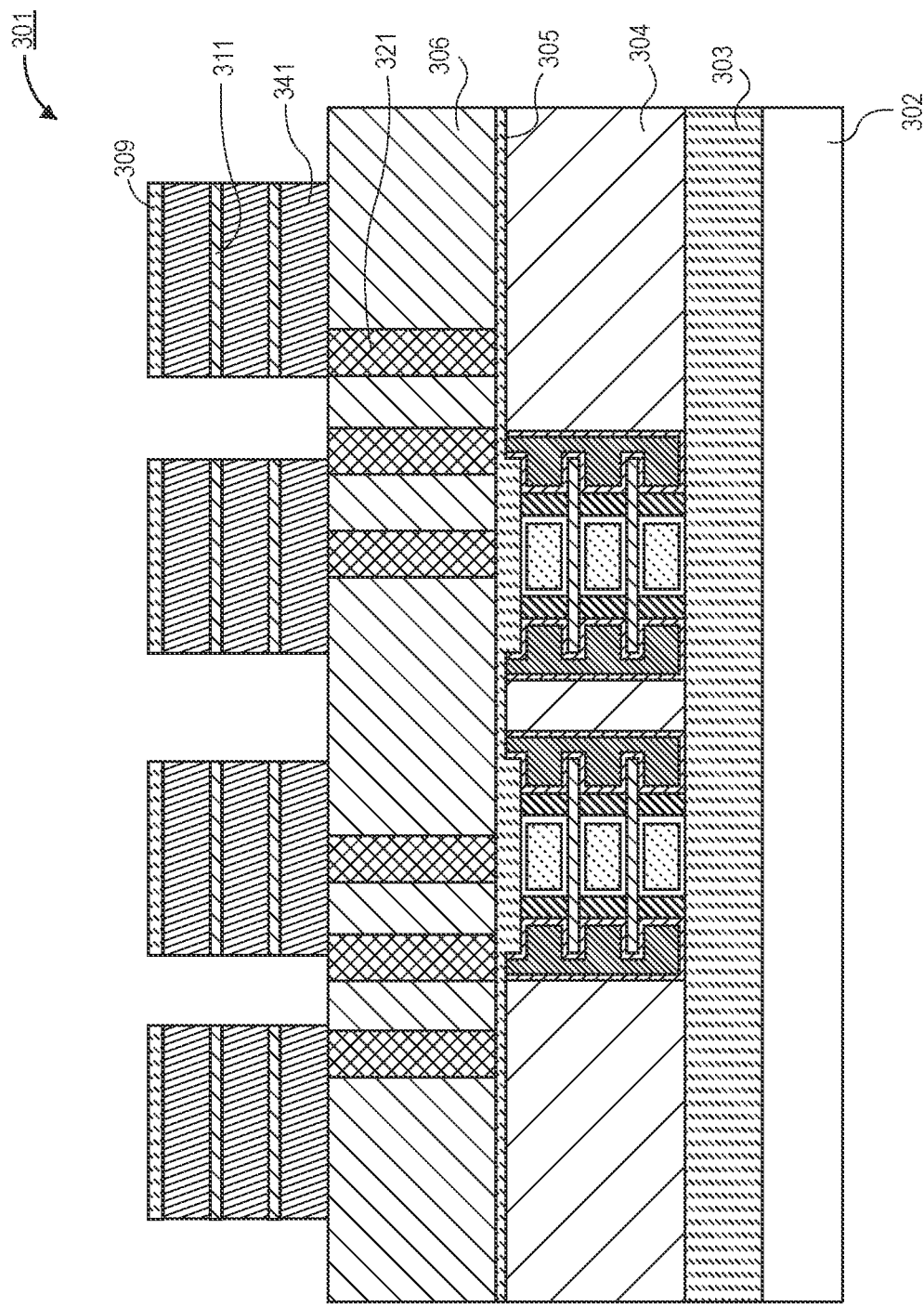
FIG. 3K is a cross-sectional illustration of the structure after device stacks with channels and sacrificial layers are formed over the insulating layer, in accordance with an embodiment.
Figure 3L:
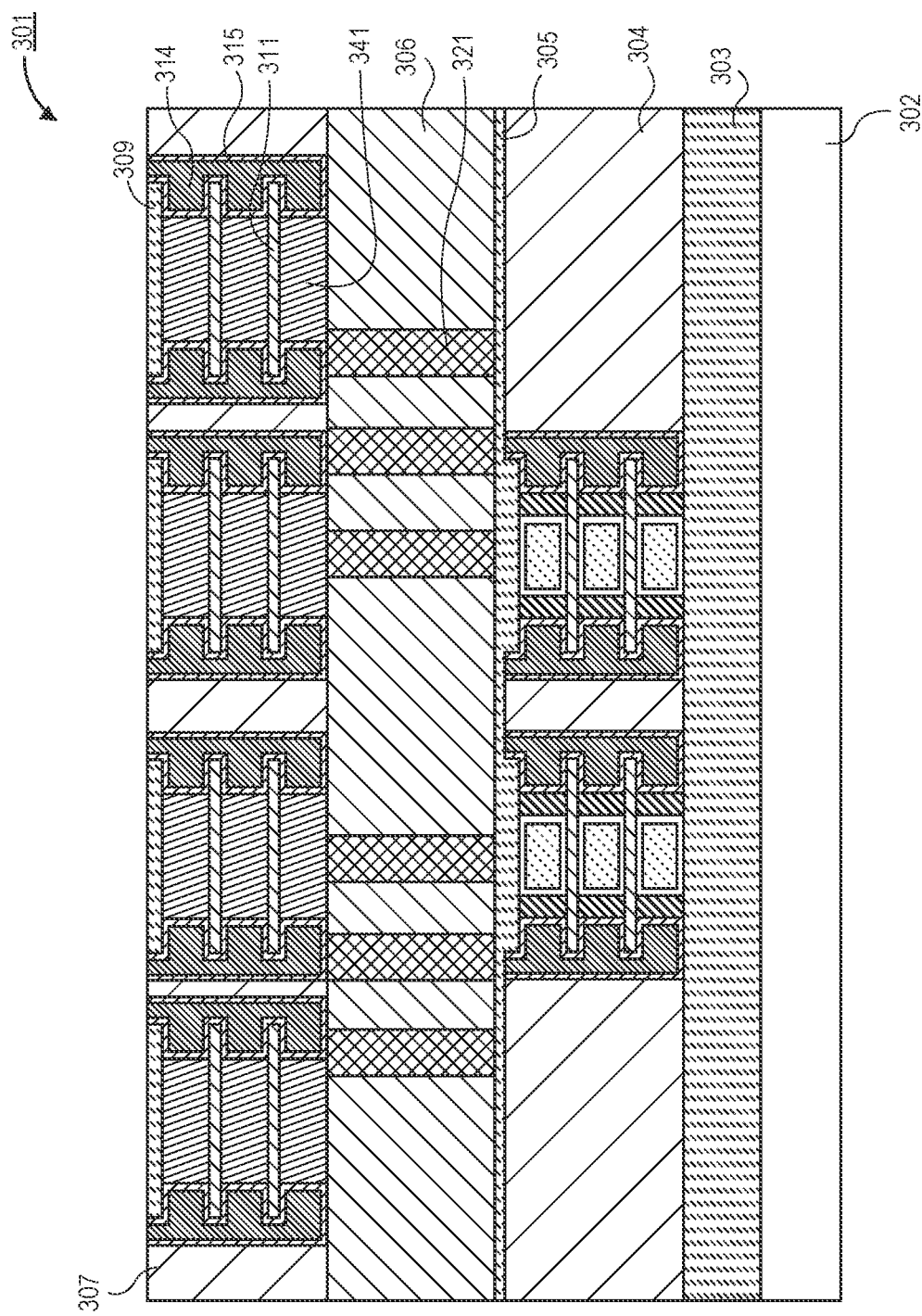
FIG. 3L is a cross-sectional illustration of the structure after source contacts and drain contacts are formed over the channels, in accordance with an embodiment.
Figure 3M:
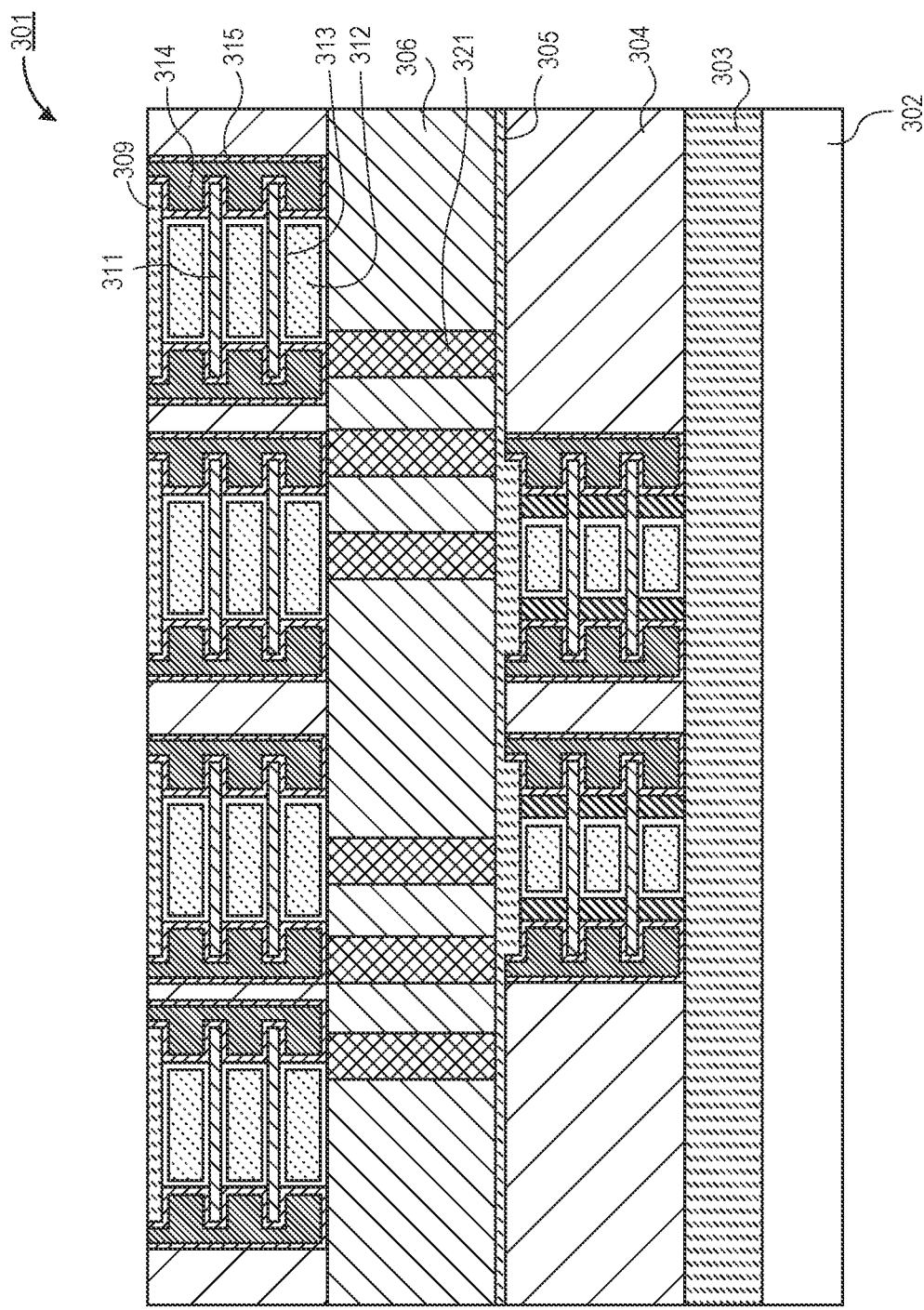
FIG. 3M is a cross-sectional illustration of the structure after gate structures are formed around the channels, in accordance with an embodiment.
Figure 3N:
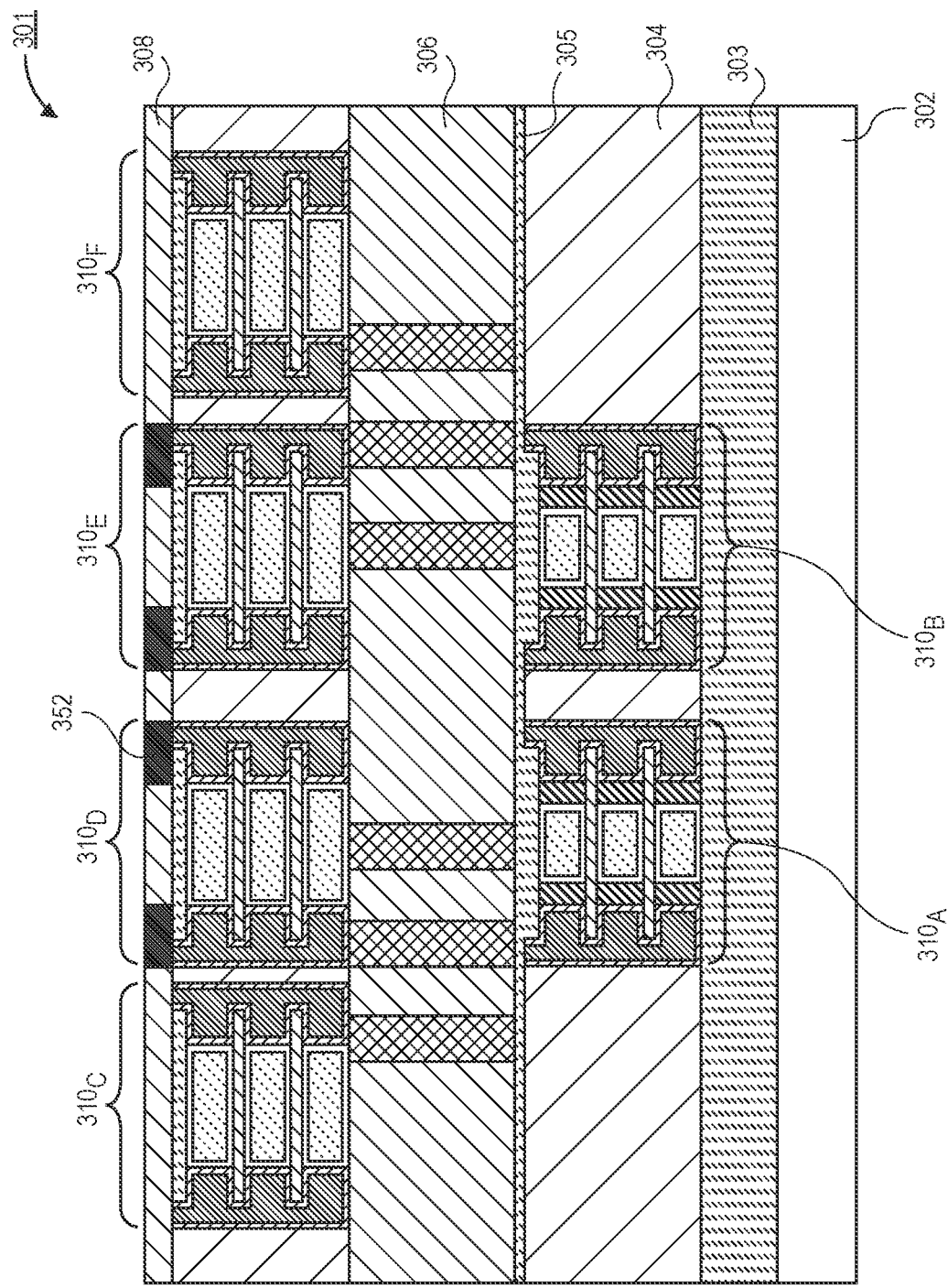
FIG. 3N is a cross-sectional illustration of the structure after contacts are made to the top transistors, in accordance with an embodiment.

Referring now to FIGS. 3A-3N, a series of cross-sectional illustrations depicting a process for forming a semiconductor device with a plurality of transistors is shown, in accordance with an embodiment. In an embodiment, the semiconductor device in FIGS. 3A-3N may be substantially similar to the semiconductor device 201 described with respect to FIG. 2.

Referring now to FIG. 3A, a cross-sectional illustration of a semiconductor device 301 at a stage of manufacture is shown, in accordance with an embodiment. In an embodiment, the semiconductor device 301 may include a substrate 302 and an insulator 303 over the substrate 302. The substrate 302 may be a semiconductor substrate, such as a silicon substrate. In an embodiment, device stacks are provided over the insulator 303. The device stacks may include semiconductor channels 311 alternating with sacrificial layers 331. In the illustrated embodiment, a pair of semiconductor channels 311 are shown, but it is to be appreciated that any number of semiconductor channels 311 may be used. In an embodiment an insulator 305 may be provided over the top most sacrificial layer 331.

In an embodiment, sacrificial layers 331 may be any material that can be selectively etched with respect to semiconductor channels 311. Channels 311 and sacrificial layers 331 may each be a material such as, but not limited to, silicon, germanium, SiGe, GaAs, InSb, GaP, GaSb, InAlAs, InGaAs, GaSbP, GaAsSb, and InP. In a specific embodiment, channels 311 are silicon and sacrificial layers 331 are SiGe. In another specific embodiment, channels 311 are germanium, and the sacrificial layers 331 are SiGe.

Referring now to FIG. 3B, a cross-sectional illustration of the semiconductor device 301 after an insulating layer 304 is deposited is shown, in accordance with an embodiment. In an embodiment, the insulating layer 304 may be deposited over the device stacks and recessed back. In an embodiment, the insulating layer 304 may have a top surface that is substantially coplanar with a top surface of the insulator 305.

Referring now to FIG. 3C, a cross-sectional illustration of the semiconductor device 301 after openings 332 are formed along the edges of device stacks is shown, in accordance with an embodiment. As shown, the openings 332 may pass entirely through a thickness of the insulating layer 304. The openings 332 expose the ends of the sacrificial layers 331.

Referring now to FIG. 3D, a cross-sectional illustration of the semiconductor device 301 after the sacrificial layers 331 are recessed is shown, in accordance with an embodiment. In an embodiment, the sacrificial layers 331 are etched to form recesses 333. The recesses 333 expose the ends of the channels 311. In an embodiment, sacrificial layers 331 may be recessed using any known etchant that is selective to channels 311. In an embodiment, sacrificial layers 331 are recessed by a timed wet etch process. The selectivity of the etchant may be greater than 50:1 for sacrificial material over channel material. In an embodiment, the selectivity is greater than 100:1. In an embodiment where channels 311 are silicon and sacrificial layers 331 are silicon germanium, sacrificial layers 331 may be selectively removed using a wet etchant such as, but not limited to, aqueous carboxylic acid/nitric acid/HF solution and aqueous citric acid/nitric acid/HF solution. In an embodiment where channels 311 are germanium and sacrificial layers 331 are silicon germanium, sacrificial layers 331 are recessed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

Referring now to FIG. 3E, a cross-sectional illustration of the semiconductor device 301 after spacers 316 are formed over the sacrificial layers 331 is shown, in accordance with an embodiment. In an embodiment, the spacers 316 may be an insulating material. For example, the spacers 316 may include a silicon oxide or a silicon nitride. In an embodiment, the spacers 316 may be a material that is etch selective to the insulating layer 304.

Referring now to FIG. 3F, a cross-sectional illustration of the semiconductor device 301 after source/drain contacts are formed around the ends of the channels 311 is shown, in accordance with an embodiment. In an embodiment, the source/drain contacts comprise a conformal liner 315 and a fill metal 314. For example, the conformal liner 315 may include antimony, and the fill metal 314 may include gold.

Referring now to FIG. 3G, a cross-sectional illustration of the semiconductor device 301 after the sacrificial layers 331 are removed is shown, in accordance with an embodiment. In an embodiment, the sacrificial layers 331 may be removed with any suitable etching process. The etchant may have access to the sacrificial layers 331 through openings out of the plane of FIG. 3G.

Referring now to FIG. 3H, a cross-sectional illustration of the semiconductor device 301 after a gate structure is formed between the channels 311 is shown, in accordance with an embodiment. In an embodiment, the gate structure comprises a gate dielectric 313 and a gate metal 312. The gate dielectric 313 may be a high-k dielectric material, such as one of those listed in greater detail above. In an embodiment, the gate metal 312 may comprise a workfunction metal, such as one of those listed in greater detail above.

Referring now to FIG. 3I, a cross-sectional illustration of the semiconductor device 301 after insulating layer 305 and insulating layer 306 are disposed over the transistors 310A and 310E is shown, in accordance with an embodiment.

Referring now to FIG. 3J, a cross-sectional illustration of the semiconductor device 301 after vias 321 are formed through the insulating layer 306 is shown, in accordance with an embodiment. In an embodiment, the vias 321 may be formed with an etching and deposition process. In an embodiment, the vias 321 may comprise any conductive material, such as, but not limited to tungsten.

Referring now to FIG. 3K, a cross-sectional illustration of the semiconductor device 301 after device stacks are provided above the insulating layer 306 is shown, in accordance with an embodiment. In an embodiment, the device stacks include semiconductor channels 311 and sacrificial layers 341. In an embodiment, two channels 311 are shown. However, it is to be appreciated that any number of channels 311 may be used. In an embodiment, the channels 311 and the sacrificial layers 341 may be materials that are etch selective to each other. In an embodiment, an insulating layer 309 may be provided over the device stacks.

Referring now to FIG. 3L, a cross-sectional illustration of the semiconductor device 301 after source/drain contacts are formed around the ends of the channels 311 is shown, in accordance with an embodiment. In an embodiment, the insulating layer 307 may be formed around the device stacks. The sacrificial layers 341 are recessed to expose the ends of the channels 311. A conformal liner 315 and a fill metal 314 are then deposited in order to form the source/drain contacts.

Referring now to FIG. 3M, a cross-sectional illustration of the semiconductor device 301 after a gate structure is formed around the channels 311 is shown, in accordance with an embodiment. In an embodiment, the sacrificial layers 341 are removed to form a cavity between the channels 311. Thereafter, a gate dielectric 313 is conformally deposited. The gate dielectric 313 may be a high-k dielectric material, such as one listed above. A gate metal 312 is then provided over the gate dielectric 313. The gate metal 312 may be a workfunction metal, such as one listed above.

Referring now to FIG. 3N, a cross-sectional illustration of the semiconductor device 301 after an insulating layer 308 is provided over the transistors 310c-310F is shown, in accordance with an embodiment. In an embodiment, contacts 352 may be formed through the insulating layer 308.

Figure 4:
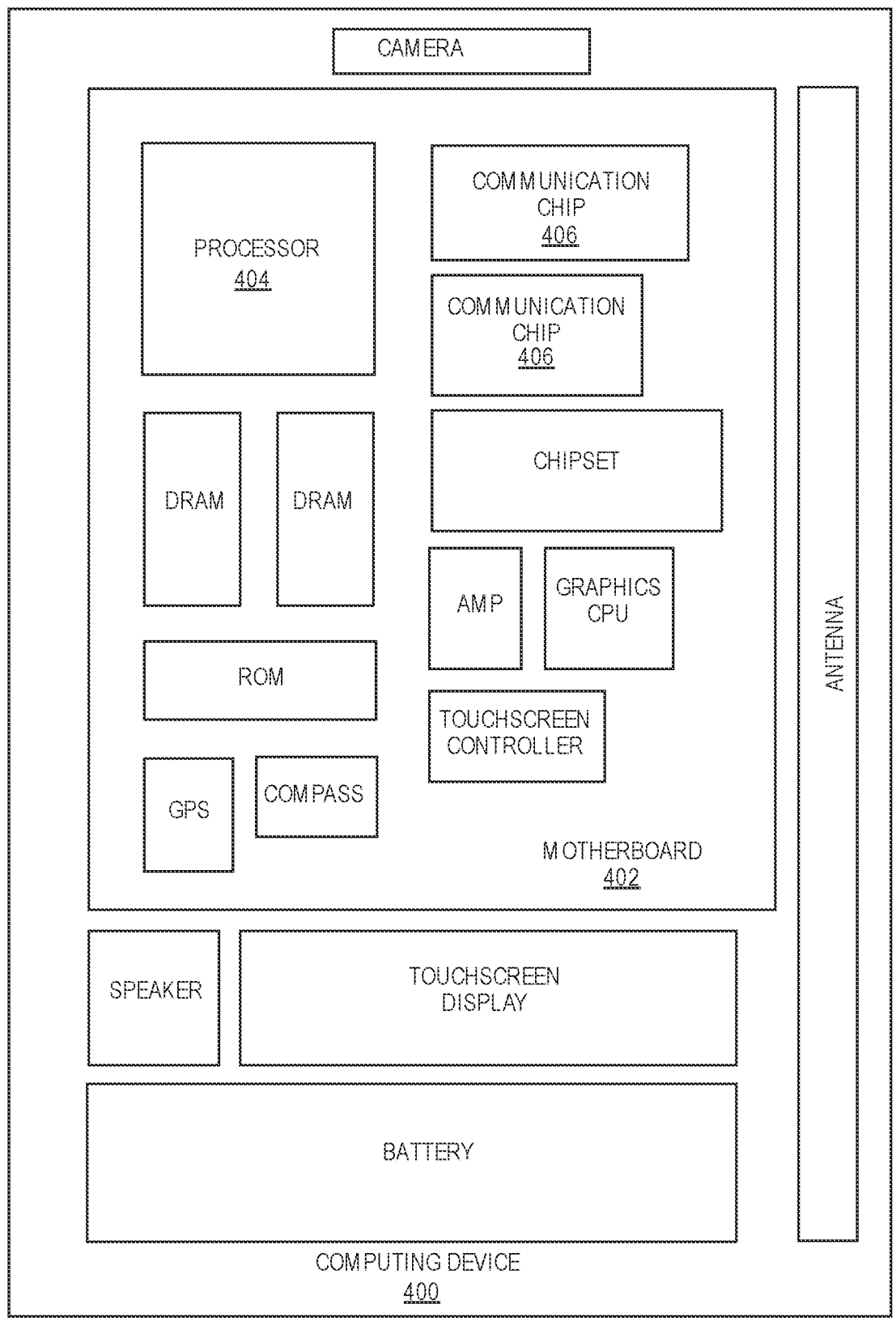
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor may comprise a memory cell with stacked transistors with a conductive via between the stacked transistors, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip may comprise a memory cell with stacked transistors with a conductive via between the stacked transistors, as described herein.

In further implementations, another component housed within the computing device 400 may comprise a memory cell with stacked transistors with a conductive via between the stacked transistors, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
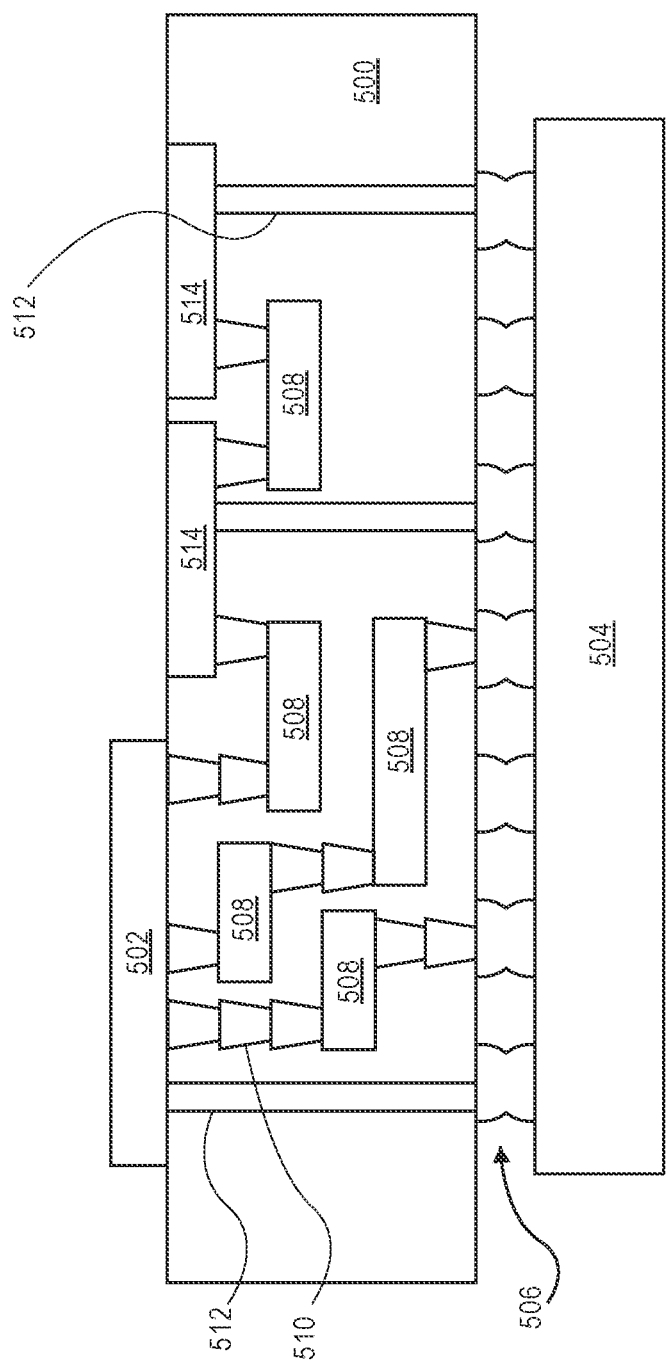
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise a memory cell with stacked transistors with a conductive via between the stacked transistors, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise a memory cell with stacked transistors with a conductive via between the stacked transistors.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a first transistor on a first level; a second transistor on a second level above the first level; an insulating layer between the first level and the second level; and a via through the insulating layer, wherein the via electrically couples the first transistor to the second transistor, wherein the first transistor and the second transistor comprise: a first channel; a second channel over the first channel; a gate structure between the first channel and the second channel; a source contact on a first end of the first channel and the second channel; and a drain contact on a second end of the first channel and the second channel.

Example 2: the semiconductor device of Example 1, wherein the first transistor further comprises: a first spacer between the source contact and the gate structure; and a second spacer between the drain contact and the gate structure.

Example 3: the semiconductor device of Example 1 or Example 2, wherein the source contact and the drain contact wrap around ends of the first channel and ends of the second channel.

Example 4: the semiconductor device of Examples 1-3, wherein the source contact and the drain contact comprise a conformal layer and a fill layer.

Example 5: the semiconductor device of Example 4, wherein the conformal layer comprises antimony and the fill layer comprises gold.

Example 6: the semiconductor device of Examples 1-5, wherein the via electrically couples the source contact of the first transistor to the source contact of the second transistor.

Example 7: the semiconductor device of Examples 1-6, wherein the first transistor is a P-type transistor, and wherein the second transistor is an N-type transistor.

Example 8: the semiconductor device of Examples 1-7, wherein the first transistor and the second transistor are components of an SRAM cell.

Example 9: the semiconductor device of Example 8, wherein the first transistor and the second transistor are components of a six transistor (6T) SRAM cell.

Example 10: the semiconductor device of Examples 1-9, wherein the first transistor and the second transistor are gate-all-around (GAA) transistors.

Example 11: an SRAM cell comprising: a first transistor in a first layer; a second transistor in the first layer; a third transistor in a second layer; a fourth transistor in the second layer; a fifth transistor in the second layer; a sixth transistor in the second layer; an insulating layer between the first layer and the second layer; and vias through the insulating layer, wherein the vias electrically couple the first transistor and the second transistor to the fourth transistor and the fifth transistor.

Example 12: the SRAM cell of Example 11, wherein the first transistor and the second transistor are P-type transistors, and wherein the third transistor, the fourth transistor, the fifth transistor, and the sixth transistor are N-type transistors.

Example 13: the SRAM cell of Example 11 or Example 12, wherein the transistors comprise: a first channel; a second channel over the first channel; a gate structure between the first channel and the second channel; a source contact on a first end of the first channel and the second channel; and a drain contact on a second end of the first channel and the second channel.

Example 14: the SRAM cell of Example 13, wherein the first transistor and the second transistor further comprise: a first spacer between the source contact and the gate structure; and a second spacer between the drain contact and the gate structure.

Example 15: the SRAM cell of Example 13 or Example 14, wherein the source contact and the drain contact wrap around ends of the first channel and ends of the second channel.

Example 16: the SRAM cell of Example 15, wherein the source contact and the drain contact comprise a conformal layer and a fill layer Example 17: the SRAM cell of Example 16, wherein the conformal layer comprises antimony and the fill layer comprises gold.

Example 18: an electronic system, comprising: a board; a package substrate coupled to the board; and a die coupled to the package substrate, wherein the die comprises: a first transistor on a first level; a second transistor on a second level above the first level; an insulating layer between the first level and the second level; and a via through the insulating layer, wherein the via electrically couples the first transistor to the second transistor, wherein the first transistor and the second transistor comprise: a first channel; a second channel over the first channel; a gate structure between the first channel and the second channel; a source contact on a first end of the first channel and the second channel; and a drain contact on a second end of the first channel and the second channel.

Example 19: the electronic system of Example 18, wherein the first transistor and the second transistor are part of a six transistor SRAM cell.

Example 20: the electronic system of Example 18 or Example 19, wherein the first transistor further comprises: a first spacer between the source contact and the gate structure; and a second spacer between the drain contact and the gate structure.

What is claimed is:

1. A semiconductor device, comprising:
a first transistor on a first level;
a second transistor on a second level above the first level;
an insulating layer between the first level and the second level; and
a via through the insulating layer, wherein the via electrically couples the first transistor to the second transistor, wherein each of the first transistor and the second transistor comprises:
a first channel;
a second channel over the first channel;

a gate structure between the first channel and the second channel;
a source contact on a first end of the first channel and the second channel; and
a drain contact on a second end of the first channel and the second channel.

2. The semiconductor device of claim 1, wherein the first transistor further comprises:
a first spacer between the source contact and the gate structure; and
a second spacer between the drain contact and the gate structure.

3. The semiconductor device of claim 1, wherein the source contact and the drain contact wrap around ends of the first channel and ends of the second channel.

4. The semiconductor device of claim 1, wherein the source contact and the drain contact comprise a conformal layer and a fill layer.

5. The semiconductor device of claim 4, wherein the conformal layer comprises antimony and the fill layer comprises gold.

6. The semiconductor device of claim 1, wherein the via electrically couples the source contact of the first transistor to the source contact of the second transistor.

7. The semiconductor device of claim 1, wherein the first transistor is a P-type transistor, and wherein the second transistor is an N-type transistor.

8. The semiconductor device of claim 1, wherein the first transistor and the second transistor are components of an SRAM cell.

9. The semiconductor device of claim 8, wherein the first transistor and the second transistor are components of a six transistor (6T) SRAM cell.

10. The semiconductor device of claim 1, wherein the first transistor and the second transistor are gate-all-around (GAA) transistors.

11. An SRAM cell comprising:
a first transistor in a first layer;
a second transistor in the first layer;
a third transistor in a second layer;
a fourth transistor in the second layer;
a fifth transistor in the second layer;
a sixth transistor in the second layer;
an insulating layer between the first layer and the second layer; and
vias through the insulating layer, wherein the vias electrically couple the first transistor and the second transistor to the fourth transistor and the fifth transistor, wherein each of the first, second, third, fourth, fifth and sixth transistors comprises:
a first channel;
a second channel over the first channel;
a gate structure between the first channel and the second channel;
a source contact on a first end of the first channel and the second channel; and
a drain contact on a second end of the first channel and the second channel.

12. The SRAM cell of claim 11, wherein the first transistor and the second transistor are P-type transistors, and wherein the third transistor, the fourth transistor, the fifth transistor, and the sixth transistor are N-type transistors.

13. The SRAM cell of claim 11, wherein each of the first transistor and the second transistor further comprises:
a first spacer between the source contact and the gate structure; and
a second spacer between the drain contact and the gate structure.

14. The SRAM cell of claim 11, wherein the source contact and the drain contact wrap around ends of the first channel and ends of the second channel.

15. The SRAM cell of claim 14, wherein the source contact and the drain contact comprise a conformal layer and a fill layer.

16. The SRAM cell of claim 15, wherein the conformal layer comprises antimony and the fill layer comprises gold.

17. An electronic system, comprising:
a board;
a package substrate coupled to the board; and
a die coupled to the package substrate, wherein the die comprises:
a first transistor on a first level;
a second transistor on a second level above the first level;
an insulating layer between the first level and the second level; and
a via through the insulating layer, wherein the via electrically couples the first transistor to the second transistor, wherein each of the first transistor and the second transistor comprises:
a first channel;
a second channel over the first channel;
a gate structure between the first channel and the second channel;
a source contact on a first end of the first channel and the second channel; and
a drain contact on a second end of the first channel and the second channel.

18. The electronic system of claim 17, wherein the first transistor and the second transistor are part of a six transistor SRAM cell.

19. The electronic system of claim 17, wherein each of the first transistor further comprises:
a first spacer between the source contact and the gate structure; and
a second spacer between the drain contact and the gate structure.

* * * * *